(12) United States Patent
Frame et al.

(10) Patent No.: US 7,728,610 B2
(45) Date of Patent: Jun. 1, 2010

(54) TEST INSTRUMENT PROBE WITH MEMS ATTENUATOR CIRCUIT

(75) Inventors: James Frame, Haverhill, MA (US); Crispin Metzler, Woburn, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/365,644

(22) Filed: Feb. 4, 2009

(65) Prior Publication Data

US 2009/0134893 A1 May 28, 2009

Related U.S. Application Data

(62) Division of application No. 11/435,550, filed on May 17, 2006, now Pat. No. 7,504,841.

(60) Provisional application No. 60/681,598, filed on May 17, 2005, provisional application No. 60/681,599, filed on May 17, 2005.

(51) Int. Cl.
*G01R 31/02* (2006.01)
(52) U.S. Cl. .................................................... 324/754
(58) Field of Classification Search ............... 324/158.1, 324/73.1, 750–758, 765; 702/85, 90–91; 361/234
See application file for complete search history.

(56) References Cited

U.S. PATENT DOCUMENTS

| | | | |
|---|---|---|---|
| 4,674,180 A | 6/1987 | Zavracky et al. | 29/622 |
| 4,959,515 A | 9/1990 | Zavracky et al. | 200/181 |
| 4,959,746 A | 9/1990 | Hongel | 361/13 |
| 5,191,303 A * | 3/1993 | Porter et al. | 333/81 R |
| 5,638,946 A | 6/1997 | Zavracky | 200/181 |
| 5,818,247 A * | 10/1998 | Pyun | 324/756 |
| 6,316,933 B1 * | 11/2001 | Olson | 324/158.1 |
| 6,433,657 B1 | 8/2002 | Chen | 333/262 |
| 6,603,891 B2 | 8/2003 | Schumann | 385/12 |
| 6,657,324 B1 | 12/2003 | Marumoto | 307/125 |

(Continued)

FOREIGN PATENT DOCUMENTS

WO   WO 99/19974   4/1999

OTHER PUBLICATIONS

Wittig Technologies, Company History, re ProbeScope 22-310, 2 pages, (date unknown).

(Continued)

*Primary Examiner*—Minh N Tang
*Assistant Examiner*—Trung Q Nguyen
(74) *Attorney, Agent, or Firm*—Sunstein Kann Murphy & Timbers LLP (57) ABSTRACT

One or more micromachined (MEMS) switches switch attenuators, such as resistors, into or out of a signal path, such as of a test instrument. The MEMS switches can be fabricated on the same substrate as the attenuators, or the switches or attenuators can be mounted on the same substrate as the others are fabricated. An instrument probe includes attenuators and MEMS switches that are controlled by the instrument and/or by a control circuit in the probe. Optionally, the probe includes reactive elements, such as capacitors, and MEMS switches to compensate for electrical characteristics of the probe and/or probe lead, and the probe or a test instrument automatically sets the MEMS switches to connect appropriate ones of the reactive elements to a signal path within the probe.

23 Claims, 9 Drawing Sheets

U.S. PATENT DOCUMENTS

| | | | |
|---|---|---|---|
| 6,884,950 B1 | 4/2005 | Nicholson et al. | 200/181 |
| 6,940,363 B2 | 9/2005 | Zipper et al. | 333/103 |
| 7,075,393 B2 | 7/2006 | Majumder et al. | 335/78 |
| 7,196,566 B2 * | 3/2007 | Kaiser, Jr. | 327/308 |
| 7,504,841 B2 | 3/2009 | Frame et al. | 324/754 |
| 2005/0270216 A1 | 12/2005 | Jiang et al. | 341/155 |

OTHER PUBLICATIONS

OsziFox hand-held storage oscilloscope product description, Wittig Technologies Corporation, 2 pages, Oct. 3, 1999.

ProbeScope for Linux, 6 pages, Oct. 25, 2002.

U.S. Appl. No. 11/435,550, Non-final Office Action, mailed Jul. 2, 2008, 9 pages.

* cited by examiner

PRIOR ART

TEST INSTRUMENT PROBE WITH MEMS ATTENUATOR CIRCUIT

CROSS REFERENCE TO RELATED APPLICATIONS

This application claims priority of U.S. Provisional Patent Application No. 60/681,598, filed May 17, 2005, titled "High Impedance Attenuator;" U.S. Provisional Patent Application No. 60/681,599, filed May 17, 2005, titled "Micro-Machined Switch/Relay Integrated with a Charge Pump;" and U.S. patent application Ser. No. 11/435,550, filed May 17, 2006, titled "High-Impedance Attenuator;" the entire contents of all of which are hereby incorporated by reference herein, for all purposes. This application is a divisional of U.S. patent application Ser. No. 11/435,550, filed May 17, 2006 now U.S. Pat. No. 7,504,841, titled "High-Impedance Attenuator."

TECHNICAL FIELD

The present invention relates to high-impedance attenuator circuits and, more particularly, to test equipment probes with circuits that include micromachined switches or relays.

BACKGROUND ART

Some test, laboratory and diagnostic equipment, such as oscilloscopes, digital multimeters, electrocardiograms and the like, receive electrical signals from devices or subjects under test and display or provide information about the signals. Other equipment, such as waveform generators, generate electrical signals for injection into circuits, subjects, etc. (Signal receiving and signal generating equipment is hereinafter collectively referred to as "test equipment" or "test instrument.") In test equipment, sometimes a signal must be attenuated by a known amount. For example, an oscilloscope can be used to display on a screen a waveform of a signal. The screen is of finite size; however, the oscilloscope can be used to display waveforms of signals having small amplitudes, as well as signals having large amplitudes.

To accommodate a wide range of signal amplitudes, the oscilloscope includes a set of attenuators, typically resistors. Each attenuator in the set can attenuate the signal by a different amount. Thus, a desired amount of attenuation can be achieved by switching a combination of one or more of the attenuators into a signal path of the instrument. The attenuators are used to "scale" the input signal, such as by dividing the amplitude of the signal by 1, 2 or 5 and/or by a power of 10 (i.e., by 10, 100, 1000, etc.) Signal generators, such as function generators, waveform generators, digital signal generators and the like, also employ switched attenuators, so they can produce signals having desired amplitudes.

Prior art test equipment includes manually operated mechanical switches or electromechanical relays in their chassis to switch attenuators into or out of signal paths. An electromechanical relay includes an electromagnet that, when energized, actuates a spring-loaded set of contacts to make and/or break an electrical circuit. However, these switches and relays are large and, therefore, introduce large amounts of parasitic capacitance into the signal path. This capacitance can distort the signal, thereby leading to inaccurate renderings of waveforms, etc. For example, the parasitic capacitance and resistance of the attenuators create a low-pass filter, due to the resistance-capacitance (RC) time constant of the combination of components. This filter limits the bandwidth of the test equipment.

Switches and electromechanical relays also have other drawbacks. For example, such switches and relays require their contacts to be cleaned frequently. Electromechanical relays draw a significant amount of power. In addition, mechanical switches and electromechanical relays can not be operated at high switching speeds.

It would, therefore, be desirable to switch various attenuators into or out of a signal path without the parasitic capacitance, bulk, slow speed or high power consumption characteristic of the prior art.

SUMMARY OF THE INVENTION

The present invention provides methods and apparatus for switching attenuators into or out of a circuit without manually operated mechanical switches or electromechanical relays. Embodiments of the present invention include micromachined switches or relays (collectively hereinafter "micromachined switches") in combination with attenuators. Optionally, the attenuators and/or other circuit components can be fabricated on the same wafer as the micromachined switches, or the attenuators and/or other circuit components can be attached to the wafer after the switches are fabricated. Similarly, the micromachined switches, attenuators and/or other circuit components can be mounted on a common substrate, such as on a printed circuit board (PCB).

Such combinations of micromachined switches and attenuators can be included in the signal path of a test instrument, thus reducing parasitic capacitance and, thereby, increasing the bandwidth of the test instrument. Because the micromachined switches and attenuators are much smaller than prior art switches and electromechanical relays, the micromachined switches and attenuators may be included in a test equipment probe, along with integrated circuit signal processing components, such as an analog-to-digital (A/D) converter. Including attenuators and an A/D converter in a probe moves these components electrically closer to the signal under test and reduces the effective length of the probe lead.

One embodiment of the present invention provides a probe for a test instrument. The probe includes a probe tip, a probe housing and an attenuator circuit within the probe housing. The attenuator circuit may be electrically coupled to the probe tip to receive or provide a signal from or to the tip. The attenuator circuit includes a plurality of micromachined switches. Each of the micromachined switches is capable of being in one of at least two states. A plurality of attenuators is electrically coupled to the micromachined switches. The signal may be attenuated by an amount based on the states of the micromachined switches.

The plurality of micromachined switches and the plurality of attenuators may be fabricated on a common substrate. The attenuators may include a plurality of resistors.

The probe may also include a digitization circuit within the probe housing. The digitization circuit is electrically coupled to the attenuation circuit. The digitization circuit includes an analog-to-digital converter and may be operative to provide digital data about the signal.

The probe may include a probe lead. The probe lead may include a power lead, a ground lead and/or a signal lead. The digitization circuit may be operative to send the digitized data about the signal via the signal lead. The signal lead may include an electrically conductive wire and/or an optical fiber.

The probe may include a compensation circuit within the probe housing. Such a compensation circuit is electrically coupled to the attenuation circuit. The compensation circuit includes a plurality of other micromachined switches and a plurality of reactive elements. Each of the other micromachined switches is capable of being in one of at least two states. The plurality of reactive elements is electrically coupled to the other micromachined switches. A total amount of reactance connected to the attenuation circuit is based on the states of the other micromachined switches. The plurality of reactive elements may include a plurality of capacitors.

The probe may include a reference signal source within the probe housing. Such a reference signal source is electrically coupled to the attenuation circuit.

The probe may include another micromachined switch within the probe housing. Such a micromachined switch may be electrically coupled between the reference signal source and the attenuation circuit or between the probe tip and the attenuation circuit. Optionally, two other micromachined switches may be included in the probe housing, one for each of these purposes.

The probe may include a control circuit within the probe housing. Such a control circuit may be coupled to the compensation circuit and may be operative to automatically activate a selected set of the micromachined switches in the compensation circuit.

The probe may include a probe lead and another micromachined switch within the probe housing. Such as micromachined switch is electrically coupled to the attenuation circuit and operative to receive a reference signal via the probe lead. The micromachined switch provides the reference signal to the attenuation circuit.

The probe may include another micromachined switch and a reference signal source within the probe housing. Such a reference signal source is electrically coupled to the attenuation circuit via the micromachined switch.

Another embodiment of the present invention provides a probe for a test instrument. The probe includes a probe tip, a probe housing and a compensation circuit within the probe housing. The compensation circuit is electrically coupled to the probe tip. The compensation circuit includes a plurality of micromachined switches and a plurality of reactive elements. Each of the micromachined switches is capable of being in one of at least two states. The reactive elements are electrically coupled to the micromachined switches. A total amount of reactance connected to the probe tip is based on the states of the micromachined switches.

The probe may include a reference signal source within the probe housing and electrically coupled to the compensation circuit.

The probe may include another micromachined switch within the probe housing. Such a micromachined switch may be electrically coupled between the reference signal source and the compensation circuit or between the probe tip and the compensation circuit. Optionally, two other micromachined switches may be included in the probe housing, one for each of these purposes.

The probe may include a control circuit within the probe housing. Such a control circuit may be coupled to the compensation circuit and may be operative to automatically activate a selected set of the micromachined switches in the compensation circuit.

The probe may include a probe lead and another micromachined switch within the probe housing. Such a micromachined switch may be electrically coupled to the compensation circuit and may be operative to receive a reference signal via the probe lead and provide the reference signal to the compensation circuit.

Yet another embodiment of the present invention provides a method of automatically adjusting a probe connected to a test instrument. The probe includes a housing. A plurality of micromachined switches is provided within the probe housing. Each such micromachined switch is capable of being in one of at least two states. A plurality of reactive elements is provided within the probe housing. The reactive elements are electrically coupled to the micromachined switches. A total amount of reactance is provided based on the states of the micromachined switches. The states of the micromachined switches are automatically set, such that a desired total amount of reactance is provided by the plurality of reactive elements.

Optionally, a reference signal may be provided, and a signal resulting from an interaction between the reference signal and at least some of the plurality of reactive elements may be analyzed. The states of the micromachined switches may be automatically set in response to analyzing the resulting signal.

BRIEF DESCRIPTION OF THE DRAWINGS

The invention will be more fully understood by referring to the following Detailed Description of Specific Embodiments in conjunction with the Drawings, of which.

DETAILED DESCRIPTION OF SPECIFIC EMBODIMENTS

The contents of U.S. Provisional Patent Application No. 60/681,598, filed May 17, 2005, titled "High Impedance Attenuator;" U.S. Provisional Patent Application No. 60/681,599, filed May 17, 2005, titled "Micro-Machined Switch/Relay Integrated with a Charge Pump;" U.S. patent application Ser. No. 11/435,507, filed May 17, 2006, titled "Micromachined Transducer Integrated with a Charge Pump;" and U.S. patent application Ser. No. 11/435,550, filed May 17, 2006, titled "High-Impedance Attenuator are all hereby incorporated by reference.

Figure 1:
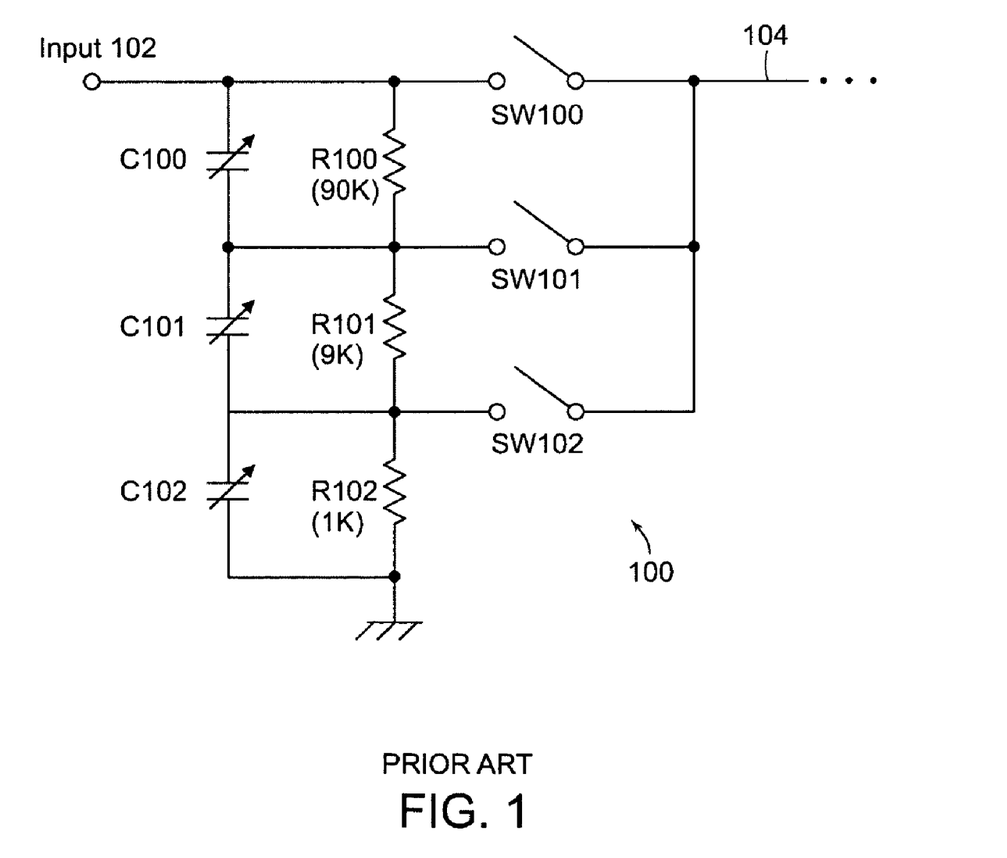
FIG. 1 is a schematic diagram of a prior art attenuator circuit.

Attenuators, such as resistors, are commonly used in "front-end" circuits of test equipment to scale down the amplitude of input signals or in "back end" circuits of test equipment that generates signals. FIG. 1 is a schematic diagram of a typical prior art front end attenuator circuit 100 from, for example, an oscilloscope. An input signal is applied to an input node 102. An output 104 from the attenuator circuit 100 is provided to a subsequent stage (not shown).

Resistors R100, R101 and R102 form a voltage divider circuit. (Exemplary values of the resistors R100-R102 are shown in FIG. 1; however, the values used in a particular circuit are matters of design choice.) One or more of the resistors R100-R102 can be selectively switched into the signal path via switches SW100, SW101 and SW102. The switches SW100-SW102 can be mechanical switches (such as multi-gang, manual rotary switches) or electromechanical relays. Variable capacitors C100, C101 and C102 are used to compensate for electrical characteristics of a probe (not shown) that is connected to the input 102.

Some prior art front-end circuits use PIN diodes as switching elements. Such front-end circuits are disfavored, because PIN diodes have non-linear current/voltage (IE) curves. Thus, PIN diode-based attenuator circuits produce less accurate signal measurements than switch-based front-end circuits.

The term "micromechanical system" (MEMS) is commonly used as a generic term for micromachined devices. A MEMS switch is an electrical switch made by surface micromachining or by other techniques used to fabricate integrated circuits on silicon or other substrates. One type of MEMS switch includes a resilient cantilevered beam and an electrically conductive pad (a "gate") proximate the beam. When opposite electrical potentials are applied to the beam and to the gate, the beam deflects toward the pad, due to an electrostatic attraction between the beam and the gate. When the potentials are removed, the beam returns to its original position.

The MEMS switch includes one or more additional electrically conductive pads (a "source" and a "drain") on the beam and/or on the substrate and positioned such that, when the beam is deflected, a portion of the beam touches the drain and completes an electric circuit between the source and the drain. In other words, a signal present on the gate of the MEMS switch controls the state of the switch, i.e., whether the switch is open or closed (whether the source is electrically connected to the drain or not).

The portion of the beam that is electrostatically attracted to the gate is usually part of the circuit between the source and the drain. Such devices are referred to as "MEMS switches." A MEMS switch typically includes three electrical connections, i.e. a source, a drain and a gate. MEMS switches are, therefore, commonly referred to as 3-pole devices.

In another device, known as a "MEMS relay," two separate drain pads are positioned under the deflected end of the beam, and the beam includes a conductive portion that bridges the two drain pads when the beam is deflected. In this case, the portion of the beam that is electrostatically attracted to the gate is usually not part of the circuit between the two separate drain pads. A MEMS relay typically includes four electrical connections, i.e. a source, a gate and two drains. A signal present on the gate of a MEMS relay controls the state of the relay, i.e., whether the relay is open or closed (whether the two drains are electrically connected to each other or not).

Techniques for fabricating MEMS switches and MEMS relays are well known to those of skill in the art. For example, U.S. Pat. Nos. 5,638,946, 4,959,515 and 4,674,180, which are hereby incorporated by reference, describe examples of MEMS switches and MEMS relays.

Alternatively, a MEMS switch or MEMS relay can use a micro-electromagnet to actuate a switch. Such a micro-magnetic switching apparatus is described in U.S. Pat. No. 6,750,745, which is hereby incorporated by reference. For the present disclosure, MEMS switches and MEMS relays include MEMS devices that are electrostatically, electromagnetically or otherwise operated. For simplicity, MEMS switches and MEMS relays are hereinafter collectively referred to as "MEMS switches."

Figure 2:
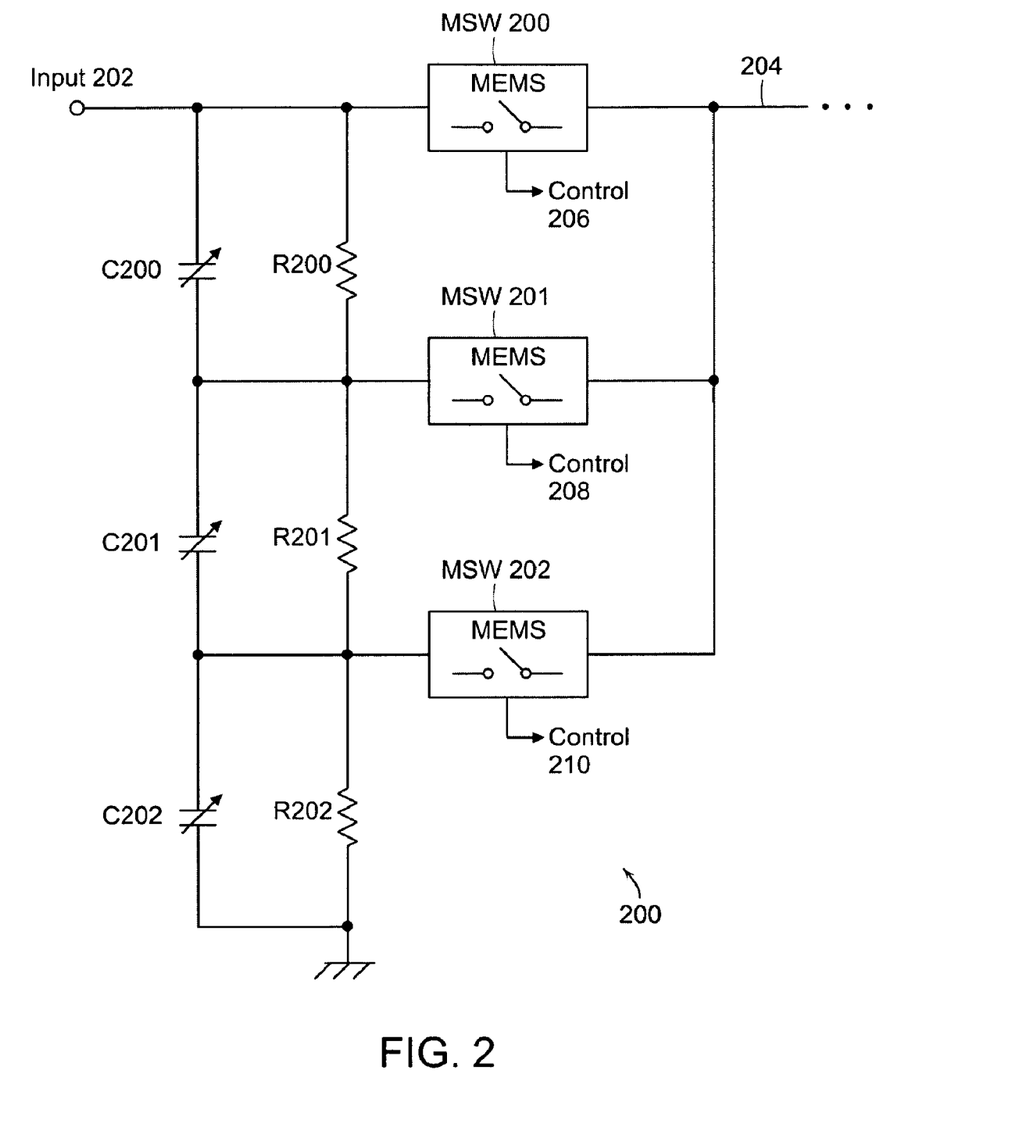
FIG. 2 is a schematic diagram of an attenuator circuit, according to one embodiment of the present invention.

FIG. 2 is a schematic of a front-end attenuator circuit 200, according to one embodiment of the present invention. An input signal is applied to an input node 202. Attenuators, such as resistors, R200, R201 and R202 form a divider circuit. MEMS switches MSW200, MSW202 and MSW203 selectively switch the attenuators R200-R202 into or out of the signal path and, thereby, provide a signal via an output 204 to a subsequent stage (not shown). Each of the MEMS switches MSW200-MSW203 is controlled by a control signal 206, 208 and 210, which is provided by a control circuit (not shown). For example, a front panel switch can be used to generate the control signals 206-208. Alternatively, other user interfaces, such as a keypad, touch screen or the like, can be used to generate the control signals 206-208. Optionally or alternatively, a control processor, such as a microprocessor, can generate the control signals 206-208 in response to user inputs or autonomously, as a result of executing a control program.

In one embodiment, the attenuators R200-R202 are fabricated on the same substrate as the MEMS switches MSW200-MSW202. For example, the attenuators R200-R202 can be film resistors that are laser trimmed after fabrication to adjust their resistance values with high precision. Alternatively, after the MEMS switches MSW200-MSW202 are fabricated, the attenuators R200-R202 can be attached to the substrate on which the MEMS switches were fabricated, or the MEMS switches can be attached to the substrate on which the attenuators were fabricated.

Figure 3:
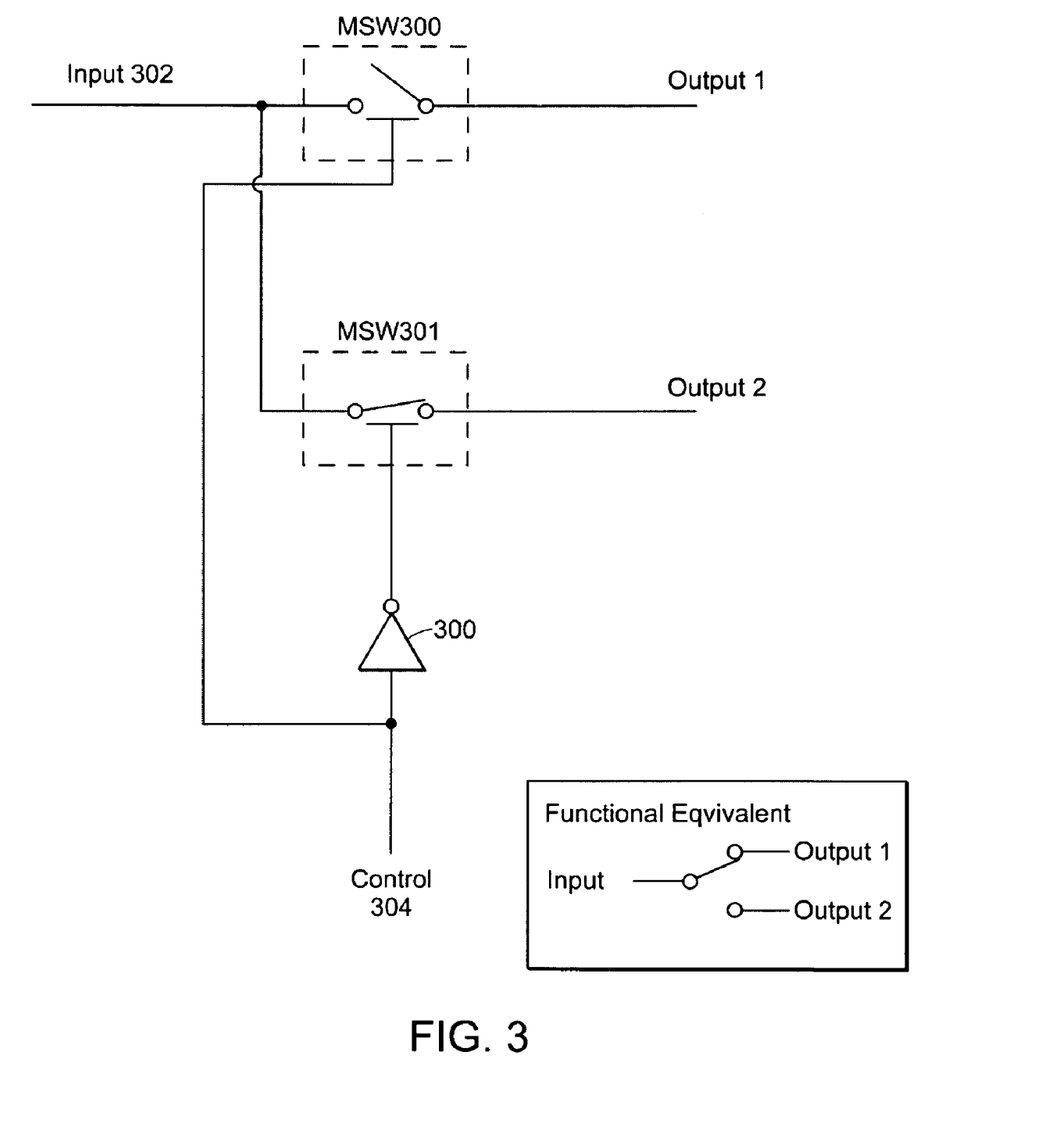
FIG. 3 is a schematic diagram of a double-throw switch, according to one embodiment of the present invention.

Although MEMS switches are typically single-pole, single-throw (SPST) (i.e., ON-OFF) devices, in some circumstances, single-pole, double-throw or other types of switches are needed. These other types of switches can be made by combining SPST switches and (when needed) logic circuits. For example, as shown in FIG. 3, two MEMS SPST switches MSW300 and MSW301 and an inverter (NOT gate) 300 are combined to create a functional equivalent to a single-pole, double-throw (SPDT) switch. An input 302 is connected to both of the MEMS switches MSW300-MSW301. A control lead 304 is connected to drive one of the MEMS switches MSW300. The control lead 304 is connected through the inverter 300 to the other MEMS switch MSW301. Thus, the two MEMS switches MSW300-MSW301 are driven by logically opposite signals. The MEMS switches MSW300-MSW301 and the inverter 300 can be combined on a single substrate or on multiple substrates, printed circuit boards (PCBs), etc. An equivalent circuit is shown in the insert of FIG. 3. Conventional power and ground lines are omitted for clarity. In other portions of this disclosure, equivalent circuit elements are shown, although as discussed above, these equivalent circuits may be made up of a combination of MEMS switches and possibly other components.

Figure 4:
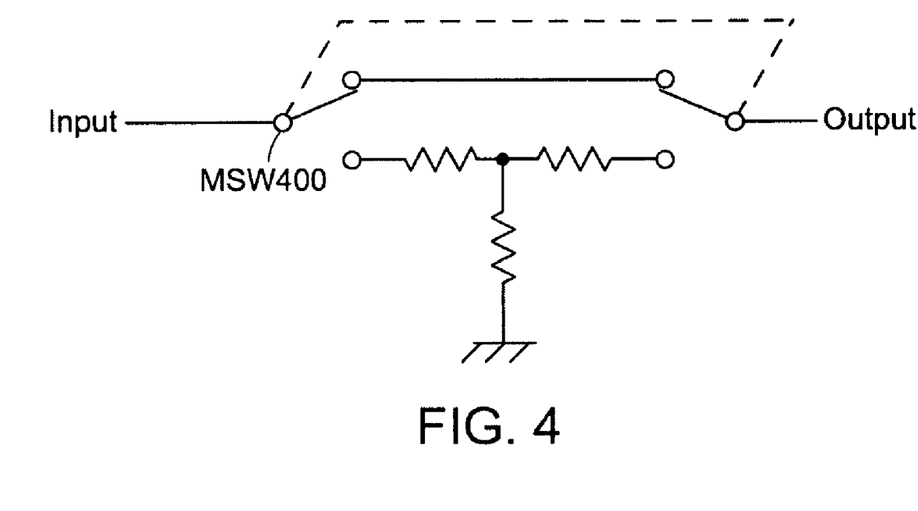
FIG. 4 is a schematic diagram of a T attenuator circuit, according to one embodiment of the present invention.
Figure 5:
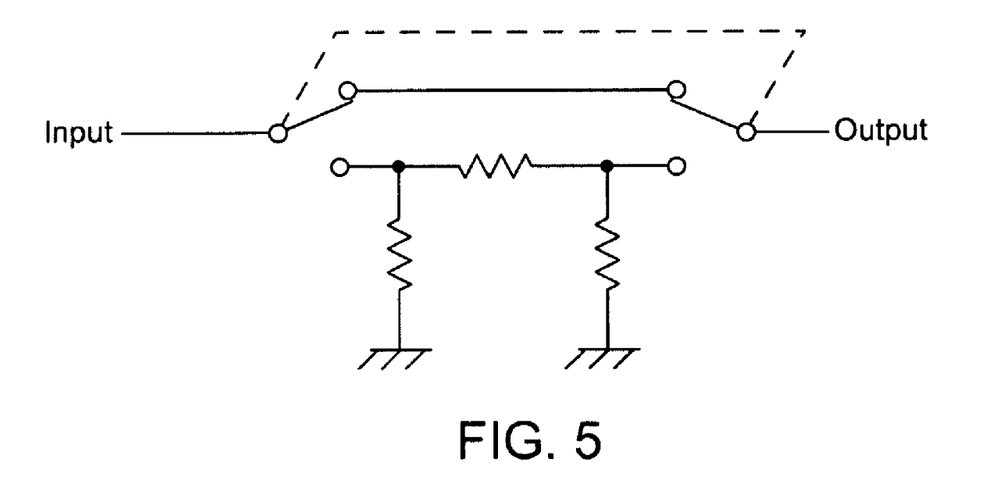
FIG. 5 is a schematic diagram of a "pi" ($\pi$) attenuator circuit, according to one embodiment of the present invention.
Figure 6:
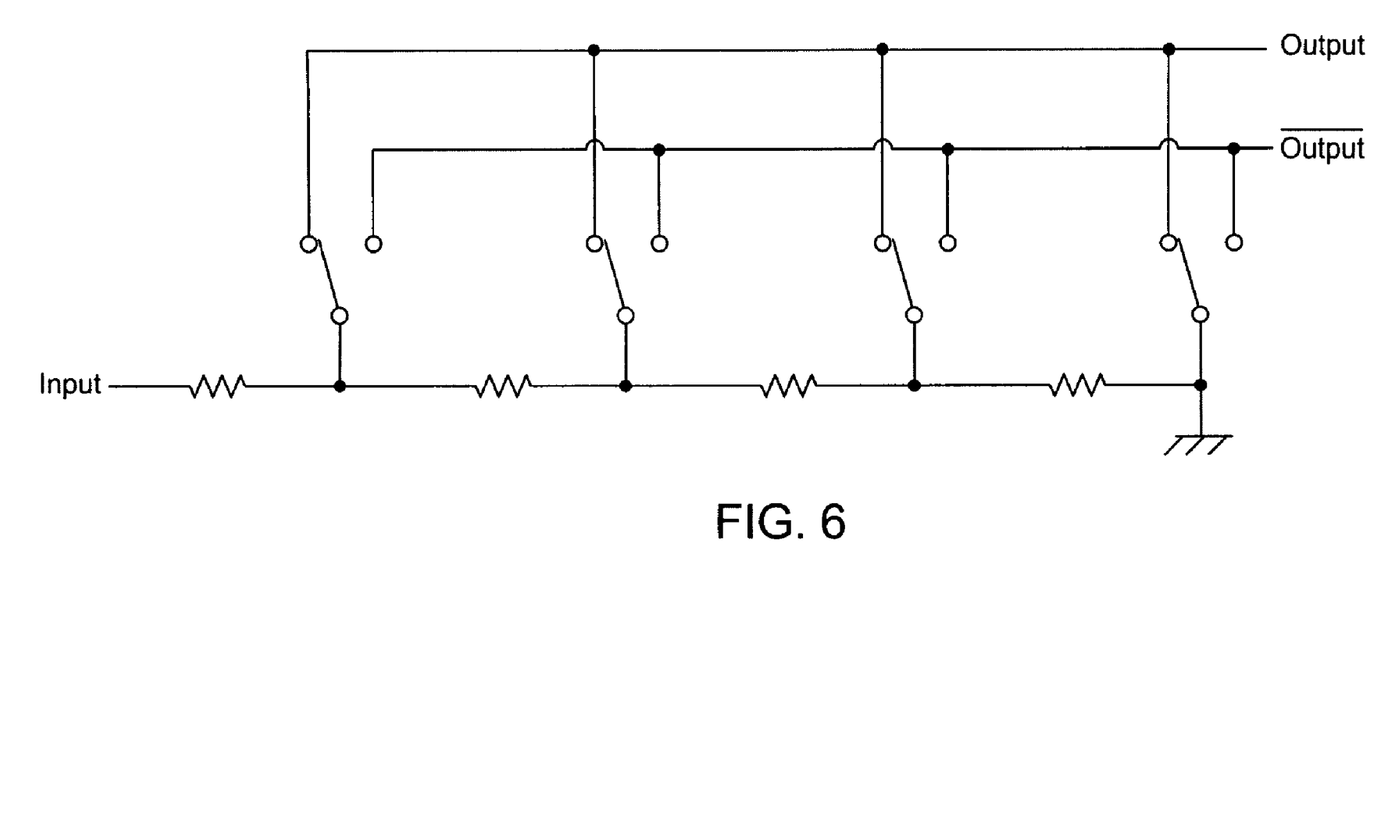
FIG. 6 is a schematic diagram of an R2R differential circuit, according to one embodiment of the present invention.
Figure 7:
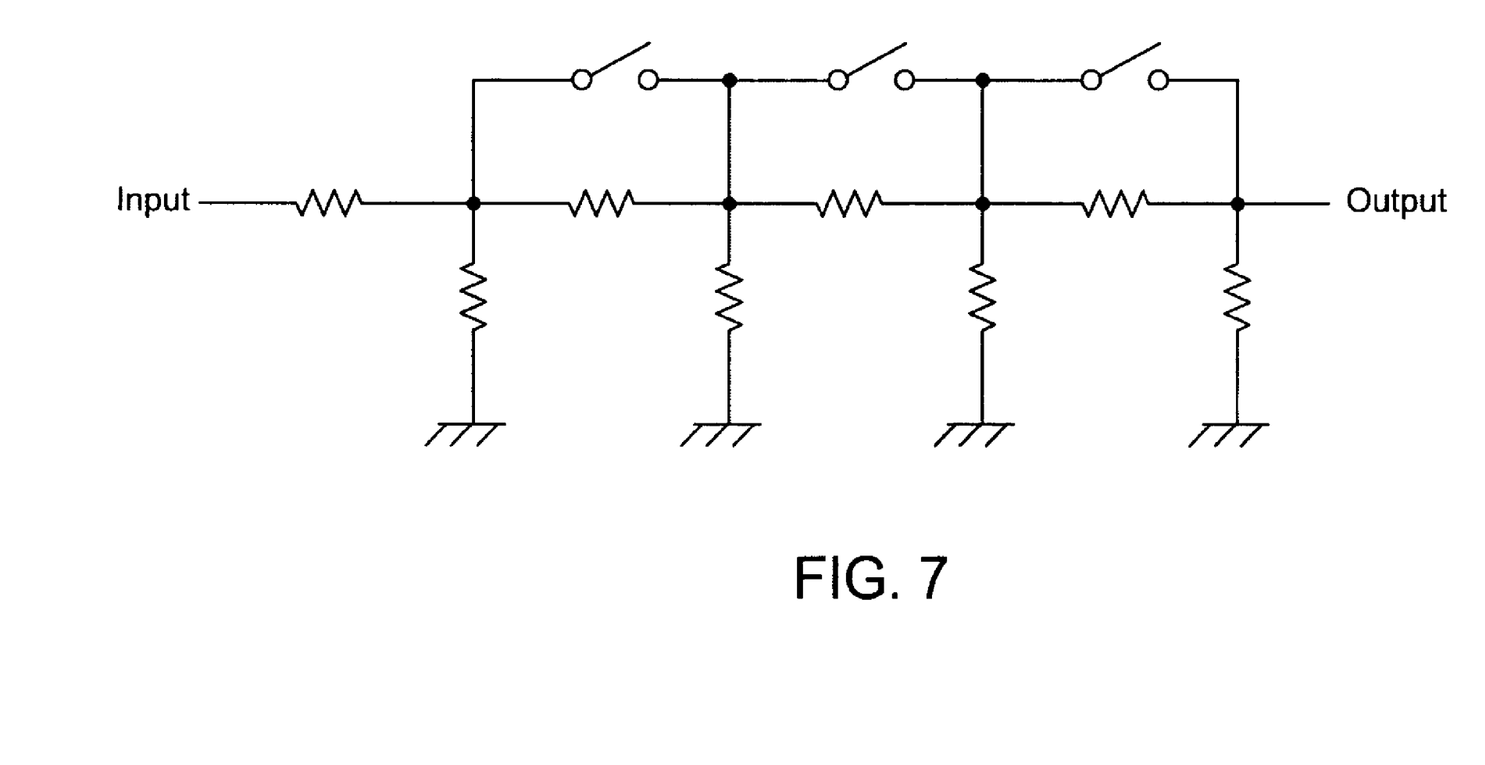
FIG. 7 is a schematic diagram of an R2R single-ended circuit, according to one embodiment of the present invention.

Many types of attenuator circuits can be constructed with MEMS switches. Four exemplary circuits are shown in FIGS. 4, 5, 6 and 7. FIG. 4 is a schematic diagram of an exemplary "T" attenuator circuit, in which several MEMS switches are combined to create a double-pole, double-throw (DPDT) switch MSW400. Similarly, as shown in FIG. 5, several MEMS switches are combined to create a DPDT switch in a "pi" ($\pi$) attenuator circuit. FIG. 6 is a schematic diagram of an R2R differential attenuation circuit that utilizes several functional equivalents to MEMS DPDT switches. FIG. 7 is a schematic diagram of an R2R single-ended attenuation circuit that utilizes MEMS SPST switches. Other types of attenuator and other circuits that require switches can also be made with MEMS switches or combinations. These and other circuits can be used in instruments, such as oscilloscopes, digital multimeters, electrocardiograms, signal analyzers, protocol analyzers, function generators, waveform generators, etc.

Figure 8:
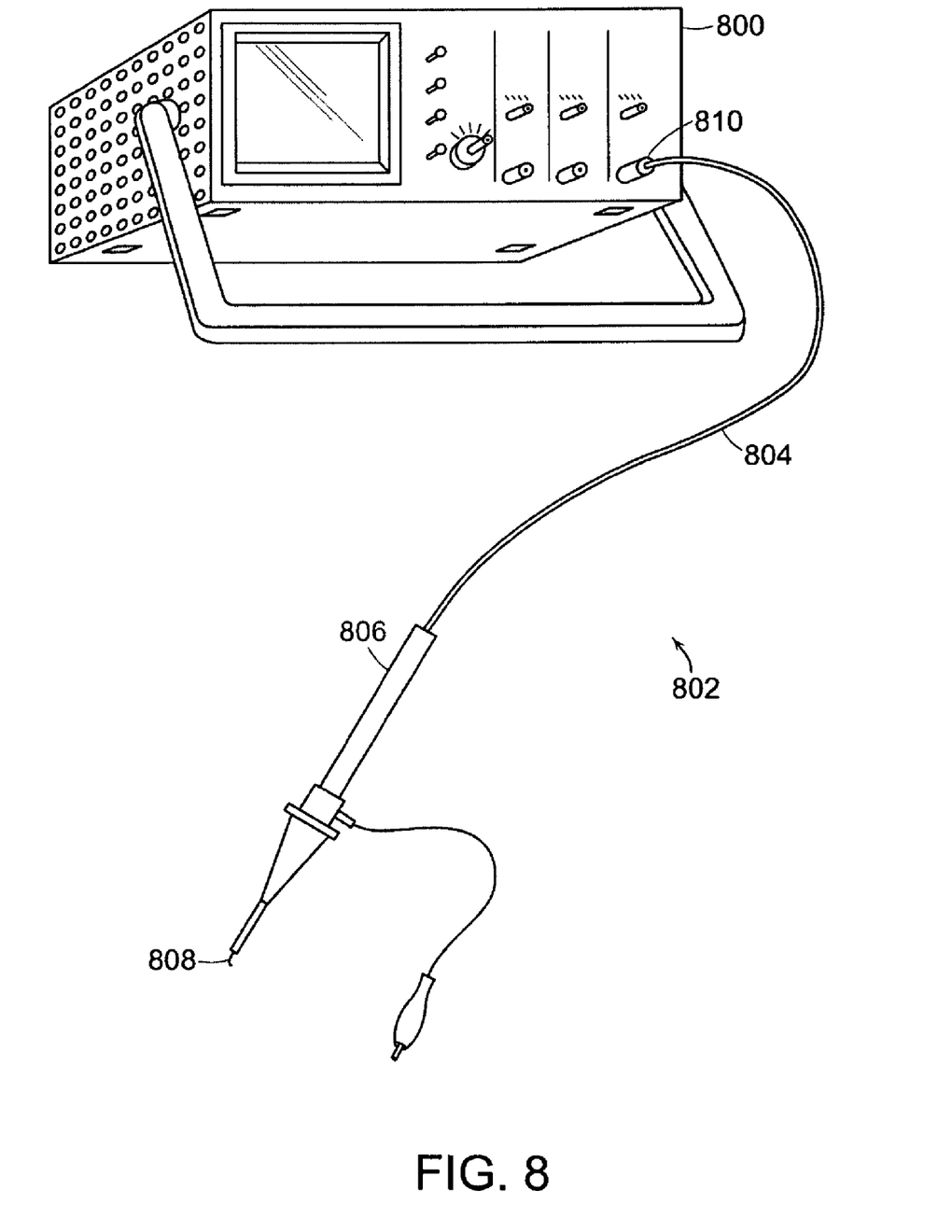
FIG. 8 is an illustration of an oscilloscope and a probe, according to one embodiment of the present invention.

Although attenuator circuits, such as those described above, can be included in test equipment, relocating these circuits so they are electrically closer to the signals under test provides advantages. For example, including an attenuator circuit in a probe of a test instrument reduces the length of wire over which the signal under test traverses before reaching the attenuator circuit. FIG. 8 is an illustration of an exemplary context in which such a probe can be used. FIG. 8 shows a test instrument 800 (for example, an oscilloscope) and a probe 802. The probe 802 includes a probe lead 804, a probe housing 806 and a probe tip 808. An attenuator circuit that includes a set of attenuators and a set of MEMS switches is located within the probe housing 806. Optionally or alternatively, another housing 810 can be included at the instrument end of the probe lead 804 or elsewhere along the probe lead. All or part of the circuits described herein as being in the probe housing 806 can, instead, be located in the other housing 810. For simplicity, the probe housing 806 and the other housing 810 (if present) are collectively hereinafter referred to as the probe housing 806.

Figure 9:
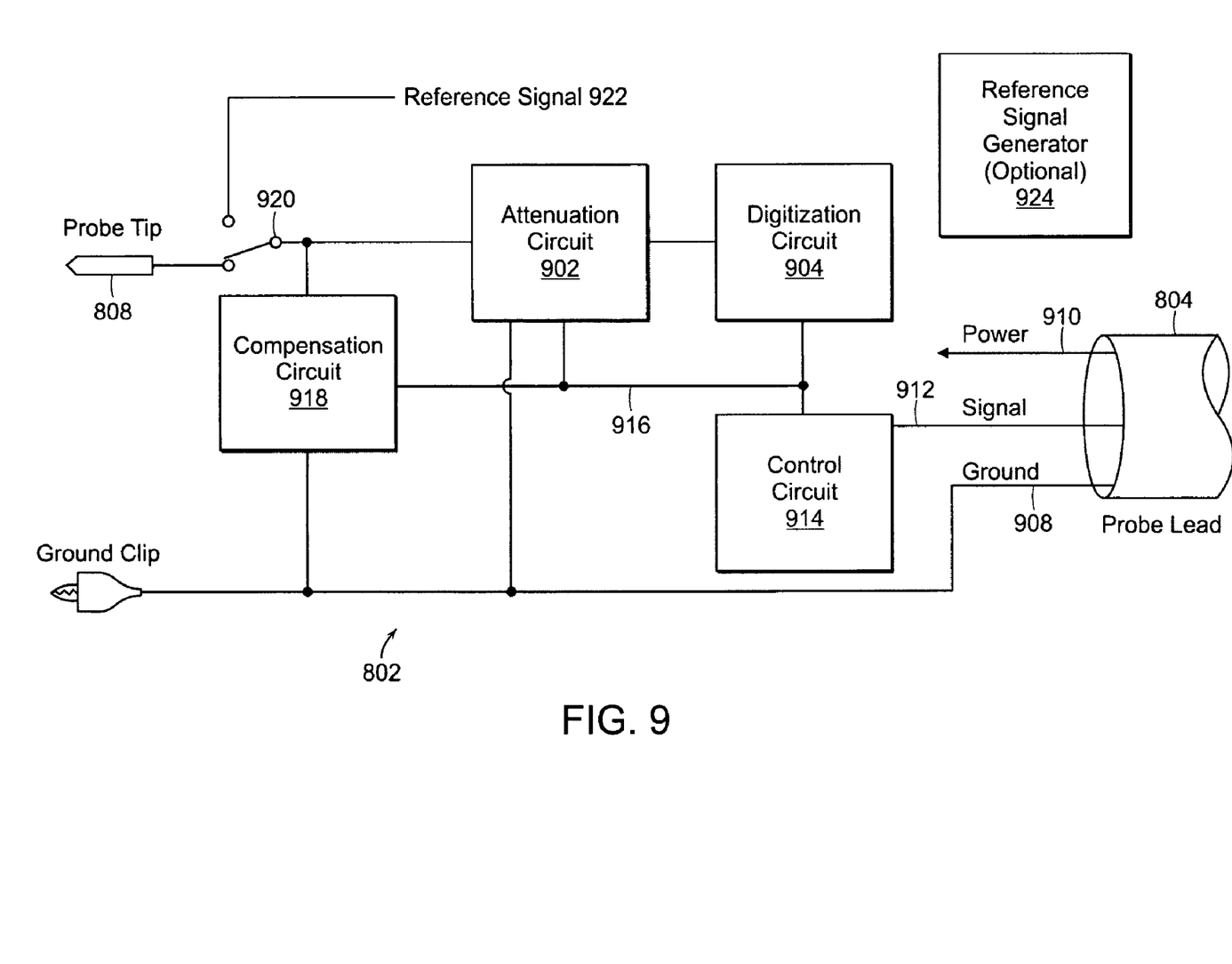
FIG. 9 is a schematic diagram of the probe of FIG. 8, according to one embodiment of the present invention.

FIG. 9 is a block diagram of the probe 802. The probe tip 808 is connected to an attenuation circuit 902. For example, the attenuation circuit 902 can be the T or π attenuation circuit shown in FIG. 4 or FIG. 5. Other well-known attenuation circuits can be used instead.

Although not shown, the probe 802 can include a differential amplifier or other circuit ahead of two probe tips. In this case, the differential amplifier produces a signal proportional to a difference between two probe tips and provides this difference signal to the probe tip 808.

The probe 802 also includes a digitization circuit 904. The digitization circuit 904 includes an analog-to-digital (A/D) converter and optionally other components that collectively digitize the analog signal applied to the probe tip 808 after the signal is attenuated by the attenuation circuit 902. The digitization circuit 904 is similar to such circuits used in test instruments. However, the digitization circuit 904 can be made on, or mounted on, the same substrate as the MEMS switches of the attenuation circuit 902.

A probe lead 804 includes a ground wire 908, a power wire 910 and a signal lead 912. When the probe 802 is connected to a test instrument, the test instrument supplies power and ground to the probe 802 via the power wire 910 and the ground wire 908, respectively. Alternatively, the signal lead 912 is omitted, and control and/or data signals that would otherwise be sent via the signal lead 912 are sent over the power wire 910.

The signal lead 912 can be an electrically conductive wire or an optical fiber. The signal lead 912 terminates at a control circuit 914, which can include combinatorial logic, a processor executing instructions stored in a memory and/or other control circuitry. Based on signals or instructions sent by the test instrument over the signal lead 912, the control circuit 914 controls operation of the MEMS switches in the attenuation circuit 902 via a bus 916.

For example, a user of the test instrument can use a front-panel switch on the test instrument to select an attenuation multiplier, or a processor in the test instrument can autonomously select the attenuation multiplier. The test instrument sends commands or signals via the signal lead 912 to the probe 802, and the control circuit interprets these commands or signals. Depending on the desired amount of attenuation, the control circuit 914 sends signals to the MEMS switches in the attenuation circuit 902 to cause an appropriate combination of attenuators to be switched into the signal path between the probe tip 808 and the digitization circuit 904.

The control circuit 914 also controls the digitization circuit 904 and/or forwards control signals from the test instrument to the digitization circuit. Digitized values of the attenuated signal under test are sent by the digitization circuit 904 to the control circuit 914, and the control circuit 914 forwards the digitized values to the test instrument via the signal lead 912. Thus, the control circuit 914 multiplexes sent and received signals over the signal lead 912. Alternatively, separate send and receive signal leads (not shown) can be used. Optionally, the digitization circuit 904, the control circuit 914 or an additional circuit (not shown) can perform additional processing on the digitized signal values.

Many instrument probes include adjustable compensating components to compensate for electrical characteristics of the probes and probe leads. For example, a typical conventional oscilloscope probe includes one or more variable capacitors, which must be adjusted as the probe lead ages or when the probe is moved from one instrument to another instrument. Typically, the instrument generates a reference signal, such as a square wave. To adjust the probe's compensation, the probe tip is attached to the instrument to receive the reference signal, and the variable capacitor(s) is(are) adjusted until the test instrument displays as nearly perfect a square wave as possible. Forgetting to adjust the compensating capacitor in an oscilloscope probe is a very common source of error.

Figure 10:
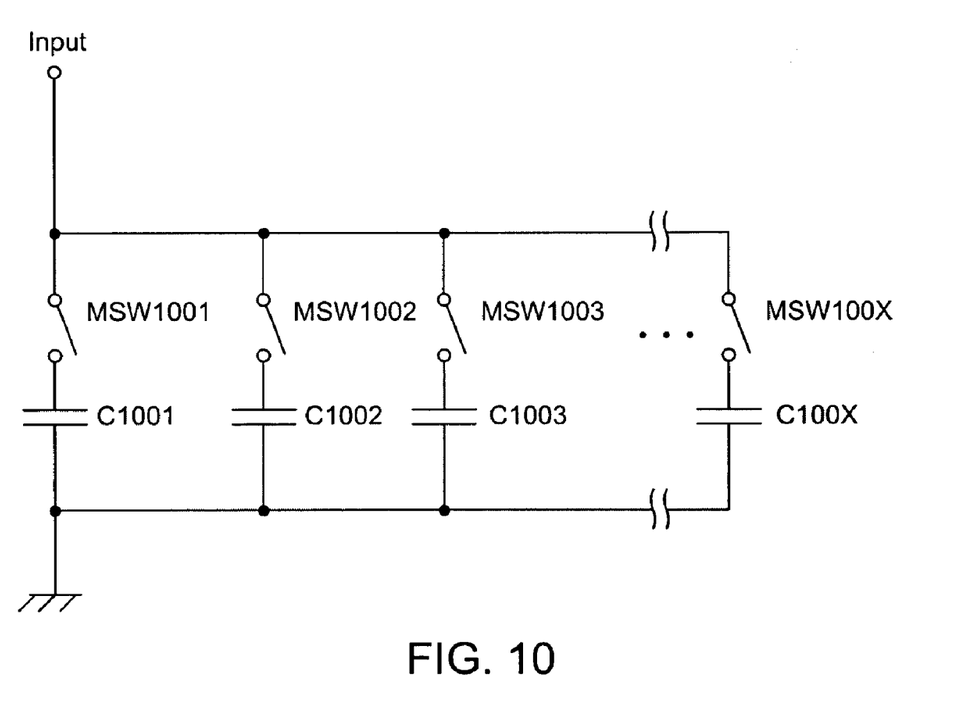
FIG. 10 is a schematic diagram of a compensation circuit of the probe of FIG. 8, according to one embodiment of the present invention.

Optionally, the probe 802 includes a compensation circuit 918. The compensation circuit 918 includes a set of MEMS switches and a set of fixed reactive elements, such as capacitors, although other types of reactive elements or combinations of types of reactive and/or resistive elements can be used. FIG. 10 is a schematic diagram of an exemplary compensation circuit. As with the attenuation circuit 902, the control circuit 914 controls MEMS switches MSW1000, MSW1001, MSW1002, . . . MSW100X of the compensation circuit to switch reactive elements, such as capacitors, C1000, C1001, C1002, . . . C100X into or out of the compensation circuit. Thus, based on the states of the MEMS switches MSW1000-MSW100X, a total amount of reactance is connected to the probe circuit. The total reactance connected to the probe circuit is the total of the reactances provided by the reactive elements C1000-C100X that are switched into the circuit. The number of capacitors C1000-C100X and their values are matters of design choice. However, the number and values should provide a range of possible total reactance values that can compensate for a likely range of electrical characteristics of the probe 802 and instruments, to which the probe is likely to be connected, in small enough increments that provide a match within a desired tolerance.

When the probe 802 is connected to the reference signal, a processor in the test instrument or in the probe analyzes the digitized signal from the probe and adjusts the compensation circuit 918 for an optimum (within the desired tolerance) match between the reference signal and the digitized signal. Thus, the probe or the test instrument can automatically configure (i.e., adjust the compensation of) the probe.

Optionally, a MEMS switch 920 in the probe 802 disconnects the probe tip 808 from the rest of the probe circuitry and connects a reference signal 922 to the probe circuitry. The reference signal 922 can be locally generated within the probe by a reference signal generator 924. For example, the reference signal generator 924 can be fabricated on, or later attached to, the same substrate as the MEMS switches of the attenuation circuit 902. Alternatively, the reference signal generator 924 can be a separate integrated circuit. Alternatively, the test instrument generates the reference signal and sends the reference signal via the probe lead 804 (such as via a shielded lead (not shown) in the probe lead or superimposed on the power lead) to the probe 802.

In either case, the compensation adjustment procedure is completely automatic. No user intervention is required. The probe or the test instrument automatically adjusts the compensation when the instrument is turned on, when the probe is connected to a different instrument or a different input channel of a given instrument, in response to changes in temperature or other environmental factors or periodically.

Functions described as being performed by control circuits and the like can be performed by a processor executing instructions stored in a memory. Alternatively, some or all of these functions can be performed by firmware and/or hardware components, such as application-specific integrated circuits (ASICs), field-programmable gate arrays (FPGAs), combinatorial digital logic or other hardware or a combination of hardware, software and/or firmware components.

While the invention is described through the above-described exemplary embodiments, it will be understood by those of ordinary skill in the art that modifications to, and variations of, the illustrated embodiments may be made without departing from the inventive concepts disclosed herein. Furthermore, combinations and subcombinations of the disclosed embodiments and features are possible. Accordingly, the invention should not be viewed as limited, except by the scope and spirit of the appended claims.

What is claimed is:

1. A probe for a test instrument, the probe comprising:
   a probe tip;
   a probe housing; and
   an attenuator circuit within the probe housing, the attenuator circuit being electrically coupled to the probe tip to receive a signal therefrom, the attenuator circuit including:
      a plurality of first micromachined switches, each of the plurality of first micromachined switches being capable of being in one of at least two states; and
      a plurality of attenuators electrically coupled to the plurality of first micromachined switches, such that the signal is attenuated by an amount based on the states of the first micromachined switches, wherein the plurality of attenuators forms a circuit selected from a group consisting of a T circuit, a pi ($\pi$) circuit and an R2R circuit.

2. The probe of claim 1, wherein the plurality of first micromachined switches and the plurality of attenuators are fabricated on a common substrate.

3. The probe of claim 1, wherein the plurality of attenuators includes a plurality of resistors.

4. A probe for a test instrument, the probe comprising:
   a probe tip;
   a probe housing; and
   an attenuator circuit within the probe housing, the attenuator circuit being electrically coupled to the probe tip to receive a signal therefrom, the attenuator circuit including:
      a plurality of first micromachined switches, each of the plurality of first micromachined switches being capable of being in one of at least two states; and
      a plurality of attenuators electrically coupled to the plurality of first micromachined switches, such that the signal is attenuated by an amount based on the states of the first micromachined switches; the probe further comprising:
      a digitization circuit within the probe housing and electrically coupled to the attenuation circuit, the digitization circuit including an analog-to-digital converter and operative to provide digital data about the signal.

5. The probe of claim 4, further comprising a probe lead, the probe lead including: a power lead, a ground lead and a signal lead; wherein the digitization circuit is operative to send the digitized data about the signal via the signal lead.

6. The probe of claim 5, wherein the signal lead comprises an electrically conductive wire.

7. The probe of claim 5, wherein the signal lead comprises an optical fiber.

8. A probe for a test instrument, the probe comprising:
   a probe tip;
   a probe housing; and
   an attenuator circuit within the probe housing, the attenuator circuit being electrically coupled to the probe tip to receive a signal therefrom, the attenuator circuit including:
      a plurality of first micromachined switches, each of the plurality of first micromachined switches being capable of being in one of at least two states; and
      a plurality of attenuators electrically coupled to the plurality of first micromachined switches, such that the signal is attenuated by an amount based on the states of the first micromachined switches; the probe further comprising:
   a compensation circuit within the probe housing and electrically coupled to the attenuation circuit, the compensation circuit including:
      a plurality of second micromachined switches, each of the plurality of second micromachined switches being capable of being in one of at least two states; and
      a plurality of reactive elements electrically coupled to the plurality of second micromachined switches, such that a total amount of reactance connected to the attenuation circuit is based on the states of the second micromachined switches.

9. The probe of claim 8, wherein the plurality of reactive elements includes a plurality of capacitors.

10. The probe of claim 8, further comprising a reference signal source within the probe housing and electrically coupled to the attenuation circuit.

11. The probe of claim 10, further comprising a third micromachined switch within the probe housing and electrically coupled between the reference signal source and the attenuation circuit.

12. The probe of claim 10, further comprising a third micromachined switch within the probe housing and electrically coupled between the probe tip and the attenuation circuit.

13. The probe of claim 10, further comprising a control circuit within the probe housing, coupled to the compensation circuit and operative to automatically activate a selected set of the second micromachined switches.

14. The probe of claim 8, further comprising:
   a probe lead; and
   a third micromachined switch within the probe housing and electrically coupled to the attenuation circuit and operative to receive a reference signal via the probe lead and provide the reference signal to the attenuation circuit.

15. A probe for a test instrument, the probe comprising:
   a probe tip;
   a probe housing; and an attenuator circuit within the probe housing, the attenuator circuit being electrically coupled to the probe tip to receive a signal therefrom, the attenuator circuit including:
  a plurality of first micromachined switches, each of the plurality of first micromachined switches being capable of being in one of at least two states; and
  a plurality of attenuators electrically coupled to the plurality of first micromachined switches, such that the signal is attenuated by an amount based on the states of the first micromachined switches; the probe further comprising:
a second micromachined switch within the probe housing; and
a reference signal source within the probe housing and electrically coupled to the attenuation circuit via the second micromachined switch.

16. A probe for a test instrument, the probe comprising:
a probe tip;
a probe housing; and
a compensation circuit within the probe housing and electrically coupled to the probe tip, the compensation circuit including:
  a plurality of micromachined switches, each of the plurality of micromachined switches being capable of being in one of at least two states; and
  a plurality of reactive elements electrically coupled to the plurality of micromachined switches, such that a total amount of reactance connected to the probe tip is based on the states of the micromachined switches, wherein the plurality of reactive elements forms a circuit selected from a group consisting of a T circuit, a pi ($\pi$) circuit and an R2R circuit.

17. A probe for a test instrument, the probe comprising:
a probe tip;
a probe housing; and
a compensation circuit within the probe housing and electrically coupled to the probe tip, the compensation circuit including:
  a plurality of micromachined switches, each of the plurality of micromachined switches being capable of being in one of at least two states; and
  a plurality of reactive elements electrically coupled to the plurality of micromachined switches, such that a total amount of reactance connected to the probe tip is based on the states of the micromachined switches, the probe further comprising:
a reference signal source within the probe housing and electrically coupled to the compensation circuit.

18. The probe of claim 17, further comprising a second micromachined switch within the probe housing and electrically coupled between the reference signal source and the compensation circuit.

19. The probe of claim 17, further comprising a second micromachined switch within the probe housing and electrically coupled between the probe tip and the compensation circuit.

20. A probe for a test instrument, the probe comprising:
a probe tip;
a probe housing; and
a compensation circuit within the probe housing and electrically coupled to the probe tip, the compensation circuit including:
  a plurality of micromachined switches, each of the plurality of micromachined switches being capable of being in one of at least two states; and
  a plurality of reactive elements electrically coupled to the plurality of micromachined switches, such that a total amount of reactance connected to the probe tip is based on the states of the micromachined switches; the probe further comprising:
a control circuit within the probe housing and coupled to the compensation circuit and operative to automatically activate a selected set of the plurality of micromachined switches.

21. A probe for a test instrument, the probe comprising:
a probe tip;
a probe housing; and
a compensation circuit within the probe housing and electrically coupled to the probe tip, the compensation circuit including:
  a plurality of micromachined switches, each of the plurality of micromachined switches being capable of being in one of at least two states; and
  a plurality of reactive elements electrically coupled to the plurality of micromachined switches, such that a total amount of reactance connected to the probe tip is based on the states of the micromachined switches; the probe further comprising:
a probe lead; and
a second micromachined switch within the probe housing and electrically coupled to the compensation circuit and operative to receive a reference signal via the probe lead and provide the reference signal to the compensation circuit.

22. A method of automatically adjusting a probe connected to a test instrument, the probe having a housing, the method comprising:
providing a plurality of micromachined switches within the probe housing, each of the plurality of micromachined switches being capable of being in one of at least two states;
providing a plurality of reactive elements within the probe housing, the plurality of reactive elements being electrically coupled to the plurality of micromachined switches, such that a total amount of reactance is provided based on the states of the micromachined switches; and
automatically setting the states of the micromachined switches, such that a desired total amount of reactance is provided by the plurality of reactive elements.

23. The method of claim 22, further comprising:
providing a reference signal; and
analyzing a signal resulting from an interaction between the reference signal and at least some of the plurality of reactive elements;
wherein automatically setting the states of the micromachined switches comprises setting the states of the switches in response to analyzing the resulting signal.

* * * * *